United States Patent
Harms et al.

(10) Patent No.: US 9,344,345 B2
(45) Date of Patent: May 17, 2016

(54) MEMORY CELLS HAVING A SELF-ALIGNING POLARIZER

(71) Applicant: Micron Technology, Inc., Boise, ID (US)

(72) Inventors: Jonathan D. Harms, White Plains, NY (US); Wei Chen, White Plains, NY (US); Sunil S. Murthy, White Plains, NY (US)

(73) Assignee: Micron Technology, Inc., Boise, ID (US)

( * ) Notice: Subject to any disclaimer, the term of this patent is extended or adjusted under 35 U.S.C. 154(b) by 135 days.

(21) Appl. No.: 14/219,748

(22) Filed: Mar. 19, 2014

(65) Prior Publication Data

US 2015/0270480 A1    Sep. 24, 2015

(51) Int. Cl.
*H01L 29/82* (2006.01)
*H04L 12/26* (2006.01)
*H01L 43/12* (2006.01)

(52) U.S. Cl.
CPC ............. *H04L 43/08* (2013.01); *H01L 43/12* (2013.01); *H04L 43/02* (2013.01)

(58) Field of Classification Search
CPC .......... H01L 43/08; H01L 43/12; H01L 29/82; H01L 27/222; G11C 11/161
USPC .................................................. 257/421, 295
See application file for complete search history.

(56) References Cited

U.S. PATENT DOCUMENTS

| | | | |
|---|---|---|---|
| 8,072,800 B2 | 12/2011 | Chen et al. | |
| 8,558,331 B2 | 10/2013 | Zhu et al. | |
| 8,604,572 B2 | 12/2013 | Wang et al. | |
| 2007/0033799 A1 | 2/2007 | Pinarbasi | |
| 2007/0263429 A1 | 11/2007 | Yamamoto et al. | |
| 2009/0096042 A1 | 4/2009 | Rizzo et al. | |
| 2010/0091555 A1* | 4/2010 | Fukami | B82Y 10/00 365/158 |
| 2011/0012215 A1* | 1/2011 | Nguyen | B82Y 25/00 257/421 |
| 2011/0013448 A1* | 1/2011 | Nozieres | G11C 11/16 365/173 |
| 2011/0141804 A1 | 6/2011 | Apalkov et al. | |
| 2012/0153411 A1 | 6/2012 | Yu et al. | |
| 2013/0119494 A1 | 5/2013 | Li et al. | |
| 2013/0121067 A1* | 5/2013 | Kent | G11C 11/16 365/158 |
| 2013/0228884 A1* | 9/2013 | Zheng | B82Y 25/00 257/421 |
| 2013/0329490 A1 | 12/2013 | Jin et al. | |

OTHER PUBLICATIONS

Diao, Zhitao, Spin Transfer Switching in Dual MgO Magnetic Tunnel Junctions, Applied Physics Letters 90, 132508 (2007), AIP Publishing, downloaded Oct. 24, 2013, 4 pages.

International Search Report and Written Opinion from related international application No. PCT/US2015/020157, dated May 26, 2015, 12 pp.

* cited by examiner

*Primary Examiner* — Tu-Tu Ho
(74) *Attorney, Agent, or Firm* — Brooks, Cameron & Huebsch, PLLC

(57) ABSTRACT

Spin torque transfer memory cells and methods of forming the same are described herein. As an example, spin torque transfer memory cells may include a self-aligning polarizer, a pinned polarizer, and a storage material formed between the self-aligning polarizer and the pinned polarizer.

20 Claims, 3 Drawing Sheets

| 320 ↘ | ⌐322 | ⌐324 | ⌐326 | ⌐328 | ⌐330 | ⌐332 |
|---|---|---|---|---|---|---|
| SPIN TORQUE TRANSFER MEMORY CELL COMPONENT | INITIAL MAGNETIC OERIENTATION | TIME 1 | TIME 2 | TIME 3 | TIME 4 |
| SELF-ALIGNING POLARIZER | ⬇ | ⬆ ↶ | ⬆ | ⬊ | ⬆ |
| STORAGE MATERIAL | ⬇ | ⬇ | ⬋ ↶ | ⬆ ↶ | ⬆ |
| PINNED POLARIZER | ⬇ | ⬇ | ⬇ | ⬇ | ⬇ |

*Fig. 3*

| 434 ↘ | ⌐422 | ⌐436 | ⌐438 | ⌐440 | ⌐442 | ⌐444 |
|---|---|---|---|---|---|---|
| SPIN TORQUE TRANSFER MEMORY CELL COMPONENT | INITIAL MAGNETIC OERIENTATION | TIME 1 | TIME 2 | TIME 3 | TIME 4 |
| SELF-ALIGNING POLARIZER | ⬆ | ⬆ | ⬆ | ⬇ | ⬇ |
| STORAGE MATERIAL | ⬆ | ⬆ | ⬈ ↶ | ⬇ ↶ | ⬇ |
| PINNED POLARIZER | ⬇ | ⬇ | ⬇ | ⬇ | ⬇ |

*Fig. 4*

MEMORY CELLS HAVING A SELF-ALIGNING POLARIZER

TECHNICAL FIELD

The present disclosure relates generally to semiconductor memory apparatuses and methods, and more particularly to memory cells having a self-aligning polarizer.

BACKGROUND

There are many different types of memory, including random-access memory (RAM), read only memory (ROM), dynamic random access memory (DRAM), synchronous dynamic random access memory (SDRAM), flash memory, resistance variable memory, such as phase change random access memory (PCRAM) and resistive random access memory (RRAM), and magnetic random access memory (MRAM), such as spin torque transfer random access memory (STT RAM), among others.

MRAM devices can employ a storage material that can be viewed as a multi-state resistor due to different relative orientations e.g., parallel and antiparallel, of the magnetic moments, which can change the magnitude of a current passing through the device. The storage material can transition the between different relative orientations.

For example, in a write process, currents passing through conductive lines. e.g., word and/or bit lines, can be used to switch a magnetic orientation of the storage material, which can place the device in a high or low resistance state. A read process can then be used to determine the state of cell.

BRIEF DESCRIPTION OF THE DRAWINGS

FIG. 3 is a table that illustrates magnetic orientation of components of a spin torque transfer memory cell in accordance a number of embodiments of the present disclosure.

FIG. 4 is a table that illustrates magnetic orientation of components of a spin torque transfer memory cell in accordance a number of embodiments of the present disclosure.

DETAILED DESCRIPTION

Figure 1:
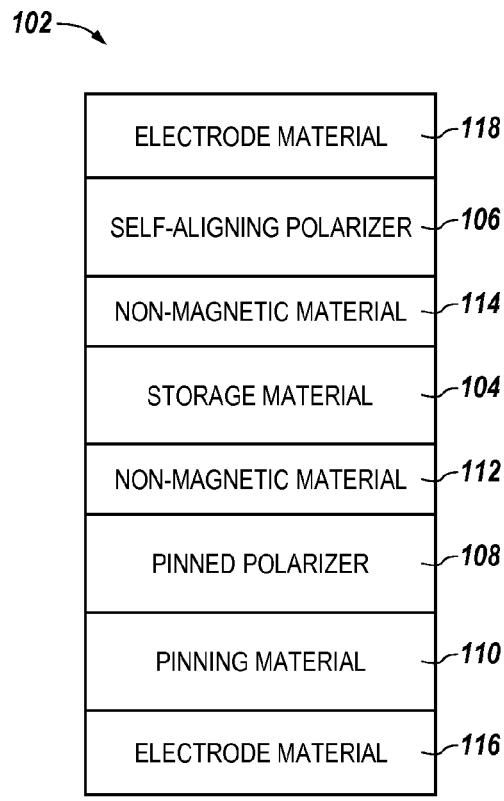
FIG. 1 illustrates a cross-sectional view of a portion of a spin torque transfer memory cell in accordance a number of embodiments of the present disclosure.

Spin torque transfer (STT) memory cells having a self-aligning polarizer and methods of forming the same are described herein. As an example, a STT memory cell can include a self-aligning polarizer, a pinned polarizer, and a storage material formed between the self-aligning polarizer and the pinned polarizer. For the STT memory cells, STT, which can also be referred to as spin transfer switching, can be utilized to switch the magnetic orientation of the storage material, e.g., storage element, thus changing a resistance of the cell.

STT utilizes spin-polarized current, e.g., a current where most of the electrons have spins aligned in the same direction, which is applied to the storage material. The electrons may get repolarized due to the orientation of the magnetic moments of the storage material. This repolarizing of the electrons can lead to the storage material experiencing a torque associated with the change in the angular momentum of the electrons as they are repolarized. As a result, if the current density is high enough, this torque has enough energy to switch the orientation, e.g., the direction, of the magnetization of the storage material. The advantages of using STT for writing to magnetic elements, e.g., the storage material, are known in the art and can include smaller footprint, space requirements, less number of steps in writing as compared with other writing techniques, scalability for large arrays, and lower writing current requirement, among others.

Previous dual polarizer STT memory cells employ two polarizers such that a current applied to the cell will pass through a first polarizer, then a free layer, and a second polarizer. These dual polarizers provide two interfaces, relative the free layer, which can each transfer angular momentum to the free layer for switching the magnetic orientation of the free layer. However, for each of these dual polarizers to transfer angular momentum to the free layer, the first polarizer and the second polarizer must be antiparallel with respect to one another, e.g., a polarizer above the free layer and a polarizer below the free layer must be oriented opposite one another. To ensure that the previous dual polarizers remained antiparallel with respect to one another, each of the dual polarizers in such previous approaches was pinned to a particular magnetic orientation, i.e. via a respective pinning layer for each of the dual polarizers. However, pinning the orientation of each of the dual polarizers can be challenging.

Embodiments of the present disclosure can provide memory cells having two polarizers, i.e. the self-aligning polarizer and the pinned polarizer, while reducing a difficulty associated with pinning two polarizers as found in previous dual polarizer memory cells. Unlike previous dual polarizer memory cells, embodiments of the present disclosure can provide dual polarizer cells, e.g., STT memory cells, having a self-aligning polarizer that is not pinned to a particular magnetic orientation and a pinned polarizer.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 106 may reference element "6" in FIG. 1, and a similar element may be referenced as 206 in FIG. 2.

FIG. 1 illustrates a cross-sectional view of a portion of a STT memory cell 102 in accordance a number of embodiments of the present disclosure. The memory cell 102 includes a storage material 104, e.g., a free material, located between a self-aligning polarizer 106 and a pinned polarizer 108. The storage material 104, which may be referred to as a free layer, can be a magnetic material, for instance. The magnetic material can be a ferromagnetic material. The magnetic materials can include Co (Cobalt), Fe (Iron), Ni (Nickel), Mn (Manganese), B (Boron), Dy (Dysprosium), Nd (Neodymium), Y (Yttrium), Sm (Samarium), Gd (Gadolinium), and/or their alloys, including for example, Cu$_2$MnAl, Cu$_2$MnIn, Cu$_2$MnSn, Ni$_2$MnAl, Ni$_2$MnIn, Ni$_2$MnSn, Ni$_2$MnSb, Ni$_2$MnGa, Co$_2$MnAl, Co$_2$MnSi, Co$_2$MnGa, Co$_2$MnGe, Pd$_2$MnAl, Pd$_2$MnIn, Pd$_2$MnSn, Pd$_2$MnSb, Co$_2$FeSi, Co$_2$FeAl, Fe$_2$VAl, Mn$_2$VGa, Co$_2$FeGe, NiFe, CoFe, CoFeB, or compounds thereof, among others. The storage material 104 can switch magnetic orientation, e.g., during a write operation via application of a current, which can place the cell 102 in a high or low resistance state. A read process, which uses a lesser magnitude current relative to a greater current magnitude of the write operation for example, can then be used to determine the state of cell 102.

As mentioned, the memory cell 102 can include a self-aligning polarizer 106. Examples of the present disclosure provide that the self-aligning polarizer 106 is not pinned to a particular magnetic orientation, e.g., the self-aligning polarizer 106 does not always remain antiparallel relative to the pinned polarizer 108. For instance, in a rest state, e.g., when a write current is not being applied to the cell 102, the self-aligning polarizer 106 can be parallel relative to the pinned polarizer 108. However, in a dynamic state, e.g., when a write current is being applied to the cell 102, the self-aligning polarizer 106 will be antiparallel relative to the pinned polarizer 108. The self-aligning polarizer 106 can be a magnetic material, as discussed herein.

As mentioned, the memory cell 102 can include a pinned polarizer 108. The pinned polarizer 108 is configured to maintain a particular magnetic orientation, e.g., that may be utilized as a fixed reference for the storage material 104 to define the high resistance state and/or the low resistance state, which can correspond to a data state "1" and/or a data state "0", respectively. The pinned polarizer 108 can be a magnetic material, as discussed herein.

The memory cell 102 can include a pinning material 110. The pinning material 110 can include an antiferromagnetic material, e.g., a synthetic antiferromagnetic material. However, examples of the present disclose are not so limited. For instance, for some examples of the present disclosure the pinning material 110 does not include an antiferromagnetic material. The pinning material 110 can include Co (Cobalt), Ni (Nickel), Pt (Platinum), Pd (Palladium), Mn (Manganese), Ir (Iridium), and/or their alloys, including for example, CoNi, CoPt, CoPd, PtMn, NiMn, PdMn, IrMn, or compounds thereof, among others.

The memory cell 102 can include a first non-magnetic material 112 and a second non-magnetic material 114. Some examples of the present disclosure provide that the non-magnetic materials 112 and 114 can be oxide materials. Examples of the non-magnetic materials 112 and 114 include oxides or nitrides of Al (Aluminum), Mg (Magnesium), Si (Silicon), Hf (Hafnium), Sr (Strontium), B (Boron), Zr (Zirconium), Zn (Zinc), or Ti (Titanium) such as, MgO, BO, BN, MgBO, ZrO$_x$, ZnO, SiO$_x$, SiN$_x$, SiO$_x$N$_y$, AlO$_x$, TiO$_x$, AlN$_x$, and/or combinations thereof, among others. The non-magnetic materials 112 and 114 can provide tunneling of electrons through the respective materials.

The memory cell 102 can include a first electrode 116 and second electrode 118. The electrodes 116 and 118 can be conductive materials, e.g., metals, such as titanium nitride, tantalum nitride, platinum, copper, tungsten, tungsten nitride, and/or ruthenium, among other conductive materials and/or combinations thereof.

As discussed, the self-aligning polarizer 106 is not pinned to a particular magnetic orientation, e.g., the self-aligning polarizer 106 can switch between magnetic orientations. More so, the self-aligning polarizer 106 can switch magnetic orientation before, e.g., quicker than, either the storage material 104 or the pinned polarizer 108 upon application of a current, such as a write current, to the cell 102. For example, the self-aligning polarizer 106 can have an anisotropy areal density value (AADV) that is less than an AADV associated with the storage material 104, which in turn is less than an AADV associated with the pinned polarizer 108. Herein, the AADV of the pinned polarizer 108 is a combination, e.g., a sum, of an AADV of the pinned polarizer 108, e.g., in isolation, and an AADV of the pinning material 110 e.g., in isolation. Anisotropy areal density value is a product of saturation magnetization (M$_s$), thickness (t) of the material, and anisotropy field (H$_k$) of the material, where M$_s$ is a strength of magnetism associated with the material, and H$_k$ is an expression of the propensity for the material's magnetization to point along only one axis, e.g., a measure of the uniaxial anisotropy of the material's magnetic properties. Anisotropy areal density value can be represented by following formula: AADV=M$_s$ t H$_k$. When a current is applied, a material with a lower a AADV will switch magnetic orientation faster than another material with a relatively higher AADV. Because the self-aligning polarizer 106 has the lowest AADV, relative to the storage material 104 and the pinned polarizer 108, when a write current is applied to the cell 102, the self-aligning polarizer 106 will switch magnetic orientation before the storage material 104 and the pinned polarizer 108.

Also, a material with a lower AADV will have a lower switching current value relative to another material with a relatively higher AADV and correspondingly higher switching current value. Because the self-aligning polarizer 106 has the lowest AADV, relative to the storage material 104 and the pinned polarizer 108, the self-aligning polarizer 106 has a lower switching current value than either the storage material 104 or the pinned polarizer 108. The switching current value is a value associated with a current, e.g., a current density, which is great enough to cause the material to switch magnetic orientations. In other words, a current having a particular value applied to the cell 102 may be sufficient to switch the magnetic orientation of the self-aligning polarizer 106, while being insufficient to switch the magnetic orientation of the storage material 104 and the pinned polarizer 108. Similarly, another current having a different particular value applied to the cell 102 may be sufficient to first switch the magnetic orientation the self-aligning polarizer 106, and then switch the magnetic orientation the storage material 104, while being insufficient to switch the magnetic orientation of the pinned polarizer 108.

As mentioned, embodiments of the present disclosure provide that the self-aligning polarizer 106 has the lowest AADV, relative to the storage material 104 and the pinned polarizer 108. The self-aligning polarizer 106 can have an AADV in a range from about 0 ergs/cm$^2$ to about 0.1 ergs/cm$^2$; for the self-aligning polarizer 106 all individual values and subranges from and including about 0 ergs/cm$^2$ to about 0.1 ergs/cm$^2$ are included herein and disclosed herein. The storage material 104 can have an a AADV in a range from about 0.05 ergs/cm$^2$ to about 1.0 ergs/cm$^2$, provided that the AADV of the storage material 104 is greater than an AADV of the self-aligning polarizer 106; for the storage material 104 all individual values and subranges from and including about 0.05 ergs/cm$^2$ to about 1.0 ergs/cm$^2$ are included herein and disclosed herein. The pinned polarizer 108 can have an AADV in a range from about 0.5 ergs/cm$^2$ to about 10.0 ergs/cm$^2$, provided that the AADV of the pinned polarizer 108 is greater than an AADV of the storage material 104; for the pinned polarizer 108 all individual values and subranges from and including about 0.5 ergs/cm$^2$ to about 10.0 ergs/cm$^2$ are included herein and disclosed herein. As mentioned, herein the AADV of the pinned polarizer 108 is a combination of an AADV of the pinned polarizer 108, e.g., in isolation, and an AADV of the pinning material 110 e.g., in isolation.

The memory cell 102 can be formed using various processing techniques such as atomic material deposition (AMD), e.g., atomic layer deposition, physical vapor deposition (PVD), chemical vapor deposition (CVD), supercritical fluid deposition (SFD), patterning, etching, filling, chemical mechanical planarization (CMP), combinations thereof, and/or other suitable processes. In accordance with a number of embodiments of the present disclosure, materials may be grown in situ. As illustrated in FIG. 1 a pinning material 110 can be formed on, e.g., subsequent to, an electrode material 116. In the example shown in FIG. 1, the pinning material 110 is formed on, e.g., in contact with, the electrode material 116. However, examples of the present disclosure are not so limited. For instance, an intervening material, not shown in FIG. 1, may separate a material formed on another material, such as the pinning material 110 and the electrode material 116, among others. Some examples of the present disclosure provide that the electrode material 116 can be a bottom electrode; however, examples of the present disclosure are not so limited. A pinned polarizer 108, e.g., a magnetic material, can be formed on the pinning material 110. A non-magnetic material 112 can be formed on the pinned polarizer 108. A storage material 104, e.g., a magnetic material, can be formed on the non-magnetic material 112. A non-magnetic material 114 can be formed on the storage material 104. A self-aligning polarizer 106, e.g., a magnetic material, can be formed on the non-magnetic material 114. An electrode material 118 can be formed on the self-aligning polarizer 106. Some examples of the present disclosure provide that the electrode material 118 can be a top electrode; however, examples of the present disclosure are not so limited.

Figure 2:
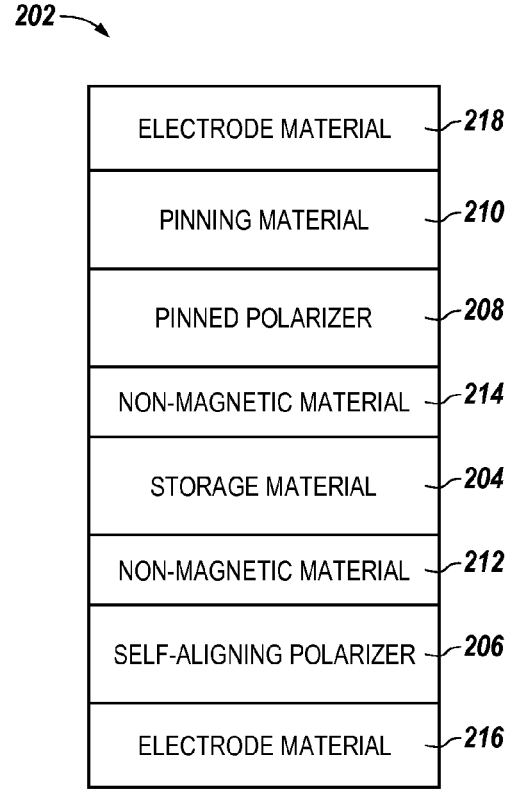
FIG. 2 illustrates a cross-sectional view of a portion of a spin torque transfer memory cell in accordance a number of embodiments of the present disclosure.

FIG. 2 illustrates a cross-sectional view of a portion of a STT memory cell 202 in accordance a number of embodiments of the present disclosure. As illustrated in FIG. 2, a self-aligning polarizer 206, e.g., a magnetic material, can be formed on an electrode material 216. Some examples of the present disclosure provide that the electrode material 216 can be a bottom electrode; however, examples of the present disclosure are not so limited. A non-magnetic material 212 can be formed on the self-aligning polarizer 206. A storage material 204, e.g., a magnetic material, can be formed on the non-magnetic material 212. A non-magnetic material 214 can be formed on the storage material 204. A pinned polarizer 208, e.g., a magnetic material, can be formed on the non-magnetic material 214. A pinning material 210 can be formed on the pinned polarizer 208. An electrode material 218 can be formed on the pinning material 210. Some examples of the present disclosure provide that the electrode material 218 can be a top electrode; however, examples of the present disclosure are not so limited.

FIG. 3 is a table 320 that illustrates magnetic orientation of components of a STT memory cell 102, as shown in FIG. 1, in accordance a number of embodiments of the present disclosure. The arrows in table 320, which correspond to magnetic orientations of the self-aligning polarizer, the storage material, and the pinned polarizer at an initial magnetic orientation, a time 1, and time 2, a time 3, and a time 4, are used to indicate the magnetic orientation of components of the STT memory cell 102 relative to one another. For instance, at a particular time if two components both have upward pointing arrows, then the magnetic orientations of those components are parallel relative to one another at that particular time. Also, at a particular time if one component has an upward pointing arrow and another component has a downward pointing arrow, then the magnetic orientations of those components are antiparallel relative to one another at that particular time.

Column 322 indicates components of the STT memory cell 102 in FIG. 1, e.g., the self-aligning polarizer 106 in FIG. 1, the storage material 104 in FIG. 1, and the pinned polarizer 108 in FIG. 1. Column 324 indicates an initial magnetic orientation, e.g., a time when the cell 102 is at a rest state, such as when a write current is not being applied to the cell 102. As shown in table 320, each of the three components has downward pointing arrow, relative to the bottom of FIG. 3, indicating that each of the three components has magnetic orientations parallel relative to one another at that the initial time. Additionally, the downward pointing arrow associated with the storage material 104 indicates that the cell 102 is in a particular resistance state, e.g., a first resistance state, which may be determined by applying a read current to the cell 102, for example. FIG. 3 illustrates magnetic orientation of the components of a STT memory cell 102 for a transition from the first resistance state to a second resistance state, e.g., a transition from a resistance state where the storage material 104 has a magnetic orientation that is parallel relative to the pinned polarizer 108 to another resistance state where the storage material 104 has a magnetic orientation that is antiparallel relative to the pinned polarizer 108.

Column 326 indicates a Time 1 where a current, e.g., a write current, is initially applied to the cell 102. Referring back to FIG. 1, this current flows from a first electrode material 116 in FIG. 1, e.g., a bottom electrode, toward a second electrode material 118 in FIG. 1, e.g., a top electrode. As shown in FIG. 3, the self-aligning polarizer 106 is the first component of the cell 102 to switch its magnetic orientation. As shown in FIG. 3, the self-aligning polarizer 106 is configured to switch magnetic orientation faster than other components of the cell, e.g., the storage material 104 and the pinned polarizer 108, switch their respective magnetic orientations. The magnetic orientation of the self-aligning polarizer 106 at Time 1 can be considered a transient state, because the self-aligning polarizer 106 is not permanently maintained at that particular magnetic orientation. Reflected spin angular momentum, which is indicated by the following icon, as shown in FIG. 3, ꕥ
can help cause the self-aligning polarizer 106 to switch magnetic orientation faster than other components of the cell 102, e.g., due to the self-aligning polarizer 106 having an AADV lower than either an AADV of the storage material 104 or an AADV of the pinned polarizer 108.

Column 328 indicates a Time 2, subsequent to Time 1, where the current is still applied to the cell 102. Transfer of spin angular momentum, which is indicated by the following icon, as shown in FIG. 3, ↓
can be directly transferred from the self-aligning polarizer 106 to the storage material 104. In addition to the directly transferred spin angular momentum, reflected spin angular momentum can be transferred to the storage material 104 via the pinned polarizer 108. As such, both the self-aligning polarizer 106 and the pinned polarizer 108 contribute to the spin torque switching of the magnetic orientation of the storage material 104. As shown in column 328, the storage material 104 is transitioning from a magnetic orientation associated with the downward pointing arrow to another magnetic orientation, e.g., a magnetic orientation associated with an upward pointing arrow, as shown in column 330 for instance.

Column 330 indicates a Time 3, subsequent to Time 2, where the current is still applied to the cell 102. At Time 3, the magnetic orientation of the storage material 104 has switched relative to the magnetic orientation of the storage material 104 shown in column 324, e.g., a write operation has occurred. As shown in FIG. 3, after the magnetic orientation of the storage material 104 has switched, e.g., as indicated by the upward facing arrow in column 330, then the magnetic orientation of the self-aligning polarizer 106 will again switch. However, now spin torque transferred from the self-aligning polarizer 106 to the storage material 104 will cancel spin torque transferred from the pinned polarizer 108 to the storage material 104, which may help to maintain the storage material 104 in its particular magnetic orientation, e.g., the magnetic orientation associated with the upward pointed arrow as shown in column 330.

Column 332 indicates a Time 4, subsequent to Time 3, where the current is no longer applied to the cell 102. As mentioned, the magnetic orientation of the self-aligning polarizer 106 is not pinned; however, due to dipole fields, for instance, the self-aligning polarizer can rest in the same direction as the storage layer 104. In other words, when the write operation is complete, e.g., when the magnetic orientation of the storage material 104 has switched relative to an initial magnetic orientation of the storage material 104 and the a current is not being applied to the cell 102, the magnetic orientation of the self-aligning polarizer 106 may be parallel relative to the magnetic orientation of the storage material 104.

FIG. 4 is a table 434 that illustrates magnetic orientation of components of a STT memory cell 102, as shown in FIG. 1, in accordance a number of embodiments of the present disclosure. Column 422 indicates components of the STT memory cell 102, e.g., the self-aligning polarizer 106 in FIG. 1, the storage material 104 in FIG. 1, and the pinned polarizer 108 in FIG. 1. Column 436 indicates an initial magnetic orientation, e.g., a time when the cell 102 is at a rest state, such as when a write current is not being applied to the cell 102. As shown in table 434, each of the self-aligning polarizer 106 and the storage material 104 has upward pointing arrow indicating that each of these components has magnetic orientations parallel relative to one another at that the initial time and that pinned polarizer 108 has a downward pointing arrow indicating it has a magnetic orientation antiparallel relative to the self-aligning polarizer 106 and the storage material 104. Additionally, the upward pointing arrow associated with the storage material 104 indicates that the cell 102 is in a particular resistance state, e.g., a second resistance state relative to the first resistance state discussed in association with FIG. 3, which may be determined by applying a read current to the cell 102, for example. FIG. 4 illustrates magnetic orientation of the components of a STT memory cell 102 for a transition from the second resistance state to the first resistance state, e.g., a transition from a resistance state where the storage material 104 has a magnetic orientation that is antiparallel relative to the pinned polarizer 108 to another resistance state where the storage material 104 has a magnetic orientation that is parallel relative to the pinned polarizer 108.

Column 438 indicates a Time 1 where a current, e.g., a write current, is initially applied to the cell 102. Referring back to FIG. 1, this current flows from a first electrode material 118 in FIG. 1, e.g., a top electrode, toward a second electrode material 116 in FIG. 1, e.g., a bottom electrode. As shown in FIG. 4, the self-aligning polarizer 106 receives directly transferred spin angular momentum via the storage material 104. Because the magnetic orientation of the self-aligning polarizer 106 and the magnetic orientation of the storage material 104 are parallel relative to one another, the magnetic orientation of the self-aligning polarizer 106 does not switch.

Column 440 indicates a Time 2, subsequent to Time 1, where the current is still applied to the cell 102. As shown in column 440, spin angular momentum can be directly transferred from the pinned polarizer 108 to the storage material 104. In addition to the directly transferred spin angular momentum, reflected spin angular momentum can be transferred to the storage material 104 via the self-aligning polarizer 106. As such, both the self-aligning polarizer 106 and the pinned polarizer 108 contribute to the spin torque switching of the magnetic orientation of the storage material 104. As shown in column 440, the storage material 104 is transitioning from a magnetic orientation associated with the upward pointing arrow to another magnetic orientation, e.g., a magnetic orientation associated with a downward pointing arrow, as shown in column 442 for instance.

Column 442 indicates a Time 3, subsequent to Time 2, where the current is still applied to the cell 102. At Time 3, the magnetic orientation of the storage material 104 has switched relative to the magnetic orientation of the storage material 104 shown in column 436, e.g., a write operation has occurred. As shown in FIG. 4, after the magnetic orientation of the storage material 104 has switched, e.g., as indicated by the downward facing arrow in column 442, then the magnetic orientation of the self-aligning polarizer 106 will switch. However, now spin torque transferred from the self-aligning polarizer 106 to the storage material 104 will cancel spin torque transferred from the pinned polarizer 108 to the storage material 104, which may help to maintain the storage material 104 in its particular magnetic orientation, e.g., the magnetic orientation associated with the downward pointed arrow as shown in column 442.

Column 444 indicates a Time 4, subsequent to Time 3, where the current is no longer applied to the cell 102. As mentioned, the magnetic orientation of the self-aligning polarizer 106 is not pinned and the self-aligning polarizer 106 can rest in the same direction as the storage material 104.

Figure 5:
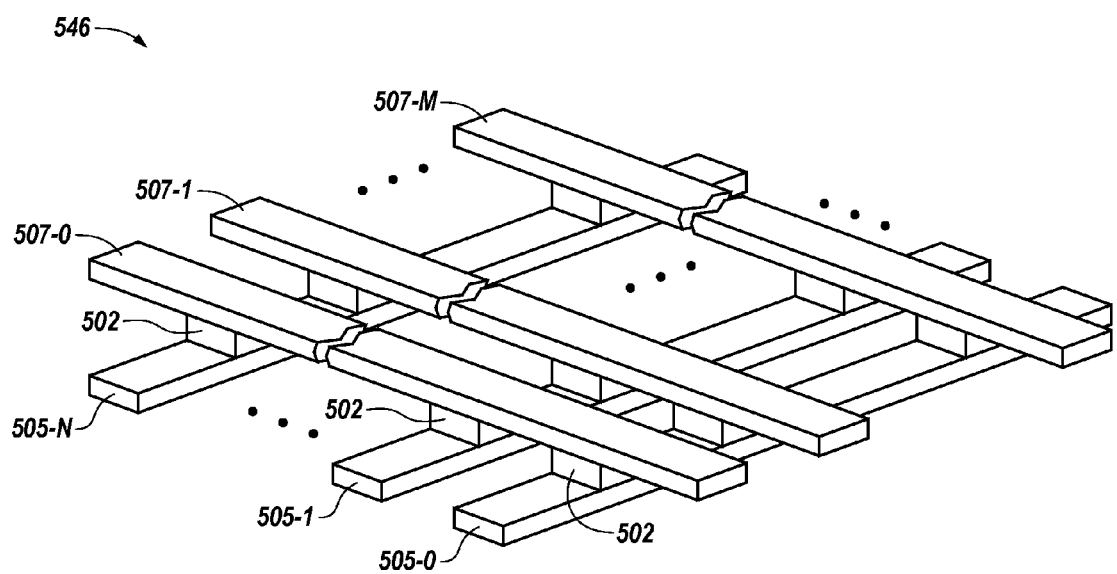
FIG. 5 illustrates an example of a portion of a memory array associated with spin torque transfer memory cells in accordance with one or more embodiments of the present disclosure.

FIG. 5 illustrates an example of a portion of a memory array 546 associated with STT memory cells in accordance with one or more embodiments of the present disclosure. In the example illustrated in FIG. 5, the array 546 is a cross point array including a first number of conductive lines 505-0, 505-1, ..., 505-N and a second number of conductive lines 507-0, 507-1, ..., 507-M. The conductive lines 505-0, 505-1, ..., 505-N can be access lines, which may be referred to herein as word lines. The conductive lines 507-0, 507-1, ..., 507-M can be data/sense lines, which may be referred to herein as bit lines. As illustrated, the word lines 505-0, 505-1, ..., 505-N can be substantially parallel to each other and are substantially orthogonal to the bit lines 507-0, 507-1, ..., 507-M, which are substantially parallel to each other; however, embodiments are not so limited.

As an example, a cell 502 can be located at each of the intersections of the word lines 505-0, 505-1, ..., 505-N and bit lines 507-0, 507-1, ..., 507-M. An access device, such as a diode, a field effect transistor (FET), or bipolar junction transistor (BJT), for a memory cell 502 may be coupled to a line, e.g., word line or bit line. The electrode materials 116, 216 and 118,218 discussed herein may be respectively coupled to a word line or bit line.

The memory cells 502 of array 546 can be operated by applying a current, e.g., a write current, across the memory cells 502 to program the memory cells 502 to a desired resistance state via selected word lines 505-0, 505-1, ..., 505-N and bit lines 507-0, 507-1, ..., 507-M. Although not illustrated in FIG. 5, the array 546 can be coupled to control circuitry configured to perform one or more embodiments described herein. For instance, the control circuitry can be configured to control programming circuitry in order to program memory cells to desired states by applying appropriate currents to word lines and bit lines associated with the array 546.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A spin torque transfer memory cell, comprising:
    a self-aligning polarizer;
    a pinned polarizer;
    a storage material formed between the self-aligning polarizer and the pinned polarizer; and
    a non-magnetic material formed between the storage material and the self-aligning polarizer, wherein the self-aligning polarizer is configured to have a first magnetic orientation parallel to a magnetic orientation of the pinned polarizer and a second magnetic orientation perpendicular to the magnetic orientation of the pinned polarizer.

2. The spin torque transfer memory cell of claim 1, wherein the self-aligning polarizer has a first switching current value and the storage material has a second switching current value, and the first switching current value is less than the second switching current value.

3. The spin torque transfer memory cell of claim 2, wherein the pinned polarizer has a third switching current value, and the second switching current value is less than the third switching current value.

4. The spin torque transfer memory cell of claim 1, further comprising a first oxide material formed between the pinned polarizer and the storage material.

5. The spin torque transfer memory cell of claim 4, wherein the non-magnetic material comprises a second oxide material formed between the storage material and the self-aligning polarizer.

6. The spin torque transfer memory cell of claim 5, further comprising a pinning material formed between the pinned polarizer and a bottom electrode.

7. The spin torque transfer memory cell of claim 5, further comprising a pinning material formed between the pinned polarizer and a top electrode.

8. A spin torque transfer memory cell, comprising:
    a first magnetic material having a first anisotropy areal density value;
    a second magnetic material having a second anisotropy areal density value that is less than the first anisotropy areal density value, wherein the second magnetic material is a storage material;
    a third magnetic material having a third anisotropy areal density value that is less than the second anisotropy areal density value; and
    a first non-magnetic material formed between the second magnetic material and the third magnetic material, wherein the third magnetic material is configured to have a first magnetic orientation parallel to a magnetic orientation of the first magnetic material and a second magnetic orientation perpendicular to the magnetic orientation of the first magnetic material.

9. The spin torque transfer memory cell of claim 8, wherein the second magnetic material is formed between the first magnetic material and the third magnetic material.

10. The spin torque transfer memory cell of claim 8, further comprising first electrode material and a second electrode material, wherein the first magnetic material, the second magnetic material, and the third magnetic material are formed between the first electrode material and the second electrode material.

11. The spin torque transfer memory cell of claim 10, further comprising a pinning material formed between the first magnetic material and the first electrode material.

12. The spin torque transfer memory cell of claim 8, further comprising a second non-magnetic material formed between the first magnetic material and the second magnetic material.

13. A spin torque transfer memory cell, comprising:
    a first magnetic material;
    a first non-magnetic material formed on the first magnetic material;
    a second magnetic material formed on the first non-magnetic material, wherein the second magnetic material is a storage material;
    a second non-magnetic material formed on the second magnetic material; and
    a third magnetic material formed on the second non-magnetic material, wherein the first magmatic material, the second magnetic material, and the third magnetic material are configured such that upon application of a current to the spin torque transfer memory cell the third magmatic material switches a magnetic orientation before the first magnetic material and before the second magnetic material and wherein the third magnetic material is configured to have a first magnetic orientation parallel to a magnetic orientation of the first magnetic material and a second magnetic orientation perpendicular to the magnetic orientation of the first magnetic material.

14. The spin torque transfer memory cell of claim 13, wherein the first magnetic material and the second magnetic material are configured such that upon application of the current to the spin torque transfer memory cell the second magmatic material switches a magnetic orientation before the first magnetic material.

15. The spin torque transfer memory cell of claim 14, further comprising a pinning material formed between the first magnetic material and a bottom electrode.

16. A spin torque transfer memory cell, comprising:
    a first magnetic material;
    a first non-magnetic material formed on the first magnetic material;

a second magnetic material formed on the first non-magnetic material, wherein the second magnetic material is a storage material;

a second non-magnetic material formed on the second magnetic material; and a third magnetic material formed on the second non-magnetic material, wherein the first magmatic material, the second magnetic material, and the third magnetic material are configured such that upon application of a current to the spin torque transfer memory cell the first magmatic material switches a magnetic orientation before the second magnetic material and before the third magnetic material and wherein the first magnetic material is configured to have a first magnetic orientation parallel to a magnetic orientation of the third magnetic material and a second magnetic orientation perpendicular to the magnetic orientation of the third magnetic material.

17. The spin torque transfer memory cell of claim 16, wherein the second magnetic material and the third magnetic material are configured such that upon application of the current to the spin torque transfer memory cell the second magmatic material switches a magnetic orientation before the third magnetic material.

18. The spin torque transfer memory cell of claim 17, further comprising a pinning material formed between the third magnetic material and a top electrode.

19. A method of forming a spin torque transfer memory cell, the method comprising:

forming a pinning material on a first electrode material;

forming a first magnetic material having a first anisotropy areal density value on the pinning material;

forming a first non-magnetic material on the first magnetic material;

forming a second magnetic material having a second anisotropy areal density value on the first non-magnetic material, wherein the second anisotropy areal density value is less than the first anisotropy areal density value and wherein the second magnetic material is a storage material;

forming a second non-magnetic material on the second magnetic material;

forming a third magnetic material having a third anisotropy areal density value on the second non-magnetic material, wherein the third anisotropy areal density value is less than the second anisotropy areal density value and wherein the third magnetic material is configured to have a first magnetic orientation parallel to a magnetic orientation of the first magnetic material and a second magnetic orientation perpendicular to the magnetic orientation of the first magnetic material; and forming a second electrode material on the third magnetic material.

20. A method of forming a spin torque transfer memory cell, the method comprising:

forming a first magnetic material having a first anisotropy areal density value on a first electrode material;

forming a first non-magnetic material on the first magnetic material;

forming a second magnetic material having a second anisotropy areal density value on the first non-magnetic material, wherein the second anisotropy areal density value is greater than the first anisotropy areal density value and wherein the second magnetic material is a storage material;

forming a second non-magnetic material on the second magnetic material;

forming a third magnetic material having a third anisotropy areal density value on the second non-magnetic material, wherein the third anisotropy areal density value is greater than the second anisotropy areal density value and wherein the first magnetic material is configured to have a first magnetic orientation parallel to a magnetic orientation of the third magnetic material and a second magnetic orientation perpendicular to the magnetic orientation of the third magnetic material;

forming a pinning material on the third magnetic material; and forming a second electrode material on the pinning material.

* * * * *